United States Patent
Mitros et al.

(10) Patent No.: US 7,813,177 B2
(45) Date of Patent: Oct. 12, 2010

(54) ANALOG SINGLE-POLY EEPROM INCORPORATING TWO TUNNELING REGIONS FOR PROGRAMMING THE MEMORY DEVICE

(75) Inventors: Jozef Czeslaw Mitros, Richardson, TX (US); David Alan Heisley, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 315 days.

(21) Appl. No.: 11/937,211

(22) Filed: Nov. 8, 2007

(65) Prior Publication Data
US 2009/0122614 A1    May 14, 2009

(51) Int. Cl.
G11C 16/04    (2006.01)
H01L 27/115    (2006.01)

(52) U.S. Cl. .............................. 365/185.1; 365/185.27; 365/185.28; 365/185.18; 365/185.03; 257/321; 257/316; 257/315

(58) Field of Classification Search ............ 365/185.03, 365/185.1, 185.27, 185.28, 185.18; 257/321, 257/316, 314, 315
See application file for complete search history.

(56) References Cited

U.S. PATENT DOCUMENTS 6,317,349 B1    11/2001    Wong
6,333,623 B1 *    12/2001    Heisley et al. ............... 323/280
6,693,830 B1    2/2004    Hu et al.
2004/0080982 A1    4/2004    Roizin
2009/0122614 A1 *    5/2009    Mitros et al. ............ 365/185.18

FOREIGN PATENT DOCUMENTS

KR    1020060035124    *    4/2006

* cited by examiner

Primary Examiner—Andrew Q Tran
(74) Attorney, Agent, or Firm—Rose Alyssa Keagy; W. James Brady; Frederick J. Telecky, Jr.

(57) ABSTRACT

A single-poly EEPROM memory device comprises a control gate isolated within a well of a first conductivity type in a semiconductor body of a second conductivity type, first and second tunneling regions isolated from one another within respective wells of the first conductivity type in the semiconductor body, a read transistor isolated within a well of the first conductivity type, and a floating gate overlying a portion of the control gate, the read transistor, and the first and second tunneling regions. The memory device is configured to be electrically programmed by changing a charge on the floating gate that changes the device threshold voltage. In one embodiment, the memory device is configured to be electrically programmed by applying a first potential between the first and second tunneling regions, and a second potential to the control gate, the second potential having a value less than the first potential.

24 Claims, 4 Drawing Sheets

ANALOG SINGLE-POLY EEPROM INCORPORATING TWO TUNNELING REGIONS FOR PROGRAMMING THE MEMORY DEVICE

FIELD OF THE INVENTION

The present invention relates generally to semiconductor device fabrication, and more particularly, to a single-poly EEPROM incorporating two tunneling regions to provide an electrically programmable continuous threshold voltage adjustment in a lower cost memory device having significantly reduced area.

BACKGROUND OF THE INVENTION

Single-polysilicon electrically erasable programmable read only memory, herein, (single-poly EEPROM, or SP EEPROM) can be an effective, low cost mechanism for providing non-volatile memory in a variety of computer related applications, such as in small handheld digital devices like cellular telephones, personal digital assistants (PDA's), etc. SP EEPROM utilizes a simple fabrication process that can be programmed and erased multiple times without utilizing the expensive and very inconvenient UV erasure technologies.

Computers and other digital devices are sometimes used to digitally adjust or trim analog to digital converters (ADC), digital to analog converters (DAC), or to program precision voltage references, for example, by programming EEPROMs coupled to trimming resistors. In making these digital adjustments of such analog devices, however, many such EEPROM devices, trim resistors and a correspondingly large die area may be required to obtain an accurate trim level or voltage reference. Although double-poly (DP) EEPROMs may also be used for such analog adjustment in a smaller die area, the DP EEPROM technology often requires expensive additional processing operations.

Accordingly, it would be desirable to provide a relatively small memory device that can be electrically programmed to obtain an accurate adjustment level, while utilizing the simpler and lower cost fabrication technology of a single-poly EEPROM device.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention comprises a single-poly EEPROM memory device that can be electrically reprogrammed to a highly accurate threshold voltage. The memory device is suitable for use as a high-resolution analog memory device, for example, for device trimming functions, for analog to digital or digital to analog conversion, or as a precision voltage reference. The inventive device requires minimal device area relative to its functionality while using the simple single-poly process technology.

According to one or more aspects of the present invention, a memory device comprises a control gate isolated within a semiconductor body, first and second tunneling regions isolated from one another within the semiconductor body, a read transistor, and a floating gate overlying a portion of the control gate, the read transistor, and the first and second tunneling regions.

In another embodiment, the single-poly EEPROM memory device comprises a control gate isolated within a well of a first conductivity type in a semiconductor body of a second conductivity type, first and second tunneling regions isolated from one another within respective wells of the first conductivity type in the semiconductor body, a read transistor isolated within a well of the first conductivity type, and a floating gate overlying a portion of the control gate, the read transistor, and the first and second tunneling regions. In this embodiment, the memory device is configured to be electrically programmed by changing a charge on the floating gate that changes the device threshold voltage (Vt).

In one embodiment, the memory device is configured to be electrically programmed by applying a first potential between the first and second tunneling regions, and a second potential to the control gate, the second potential having a value less than the first potential.

In one aspect, the memory device is configured to be electrically programmed by applying a first potential between the first and the second tunneling regions, and a second potential to the control gate.

In one method embodiment, the EEPROM memory device can be electrically programmed by providing the memory device comprising a floating gate overlying first and second tunneling regions, a control gate, and a read transistor, by applying a first potential to the first tunneling region, applying a second potential to the second tunneling region, and by applying a third potential to the control gate to induce a charge on the floating gate thereby electrically programming a threshold voltage Vt of the memory device.

In another aspect of the invention, the first and second potentials are different, wherein the third potential has a value which is between the first and second potentials.

In yet another embodiment, the read transistor is configured to determine the threshold voltage programmed into the memory device.

Thus a simple and cost effective EEPROM memory device having a reduced size that can be electrically reprogrammed to a highly accurate threshold voltage may be embedded with common CMOS devices to reduce wafer manufacturing costs.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of only a few of the various ways in which the principles of the invention may be employed. Other objects, advantages, and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided here and the accompanying description of the figures are merely provided for illustrative purposes. One of ordinary skill in the art should realize, based on the instant description, other implementations and methods for fabricating the devices and structures illustrated in the figures and in the following description.

As indicated, although conventional double-poly (DP) EPROM memory devices may require a smaller die area than single-poly (SP) EPROM memory devices, the DP EEPROM technology, may require expensive additional processing operations. Whether single-poly (SP) or double-poly (DP) is used to program an analog adjustment, numerous such conventional memory devices and trim resistors may be required to program a high accuracy trim level. For example, to trim a 16 bit A/D converter (ADC), 6 memory cells and 6 associated trim resistors may need to be programmed to various states to obtain an accurate trim level. Further, to accommodate a worse case situation, 8 memory cells and 8 associated trim resistors and the corresponding large die area requirement may need to be dedicated to the 16 bit ADC to obtain the high-accuracy trim level.

In addition, although the single-poly EEPROM memory devices can be programmed multiple times, it generally requires a large area, for example, about 50 $\mu m^2$. This large area is generally due in part to the separation required between the control gate and the read metal oxide semiconductor (MOS) transistor to accommodate the relatively high voltage requirements of electrically programming and erasing single-poly EEPROM.

Accordingly, the present invention provides a relatively small memory device that can be electrically and repeatedly programmed to a highly accurate Vt level, thereby providing continuous analog adjustment and EEPROM functionality, while still utilizing the simpler and lower cost single-poly fabrication technology. Moreover, this technology may be referred to herein, as "analog SP EEPROM".

In particular, the present invention provides a single-poly EEPROM memory device that can be electrically reprogrammed to a highly accurate threshold voltage. According to one or more aspects of the present invention, the memory device comprises a control gate isolated within a semiconductor body, first and second tunneling regions isolated from one another within the semiconductor body, a read transistor, and a floating gate overlying a portion of the control gate, the read transistor, and the first and second tunneling regions.

In one embodiment, the memory device is configured to be electrically programmed to a device threshold voltage (Vt) corresponding to a desired accurate trim level or reference voltage by changing a charge on the floating gate. For example, the memory device is configured to be electrically programmed by applying a first potential between the first and second tunneling regions, and a second potential to the control gate, the second potential having a value less than the first potential.

These and other aspects of the invention will become more apparent in light of the figures and accompanying descriptions.

Figures 1A, 1B:
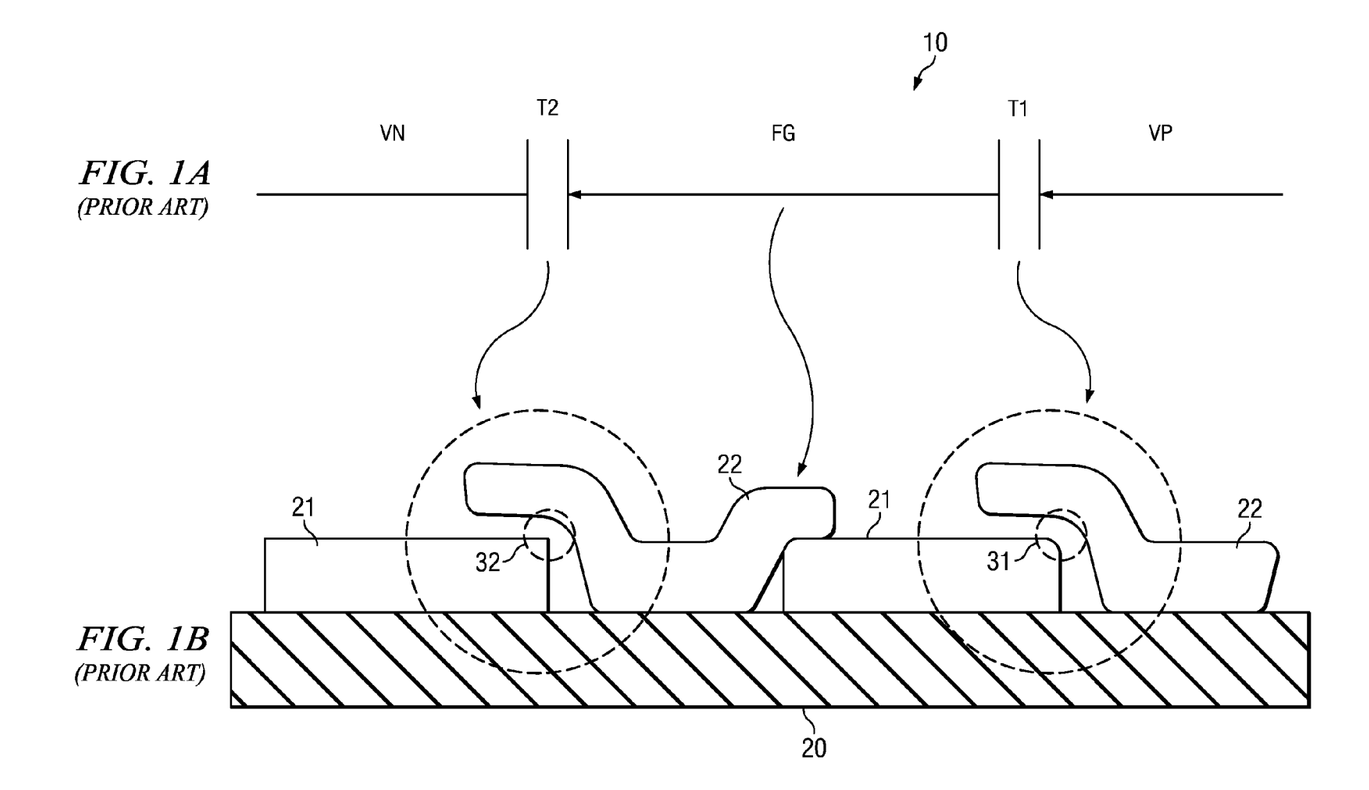
FIGS. 1A and 1B are schematic, and cross sectional side views, respectively, of a prior art double poly (DP) electrically erasable and programmable "read only" memory (EEPROM) device, for example, comprising poly1 and poly2 layers, illustrating the highly variable capacitive junctions created in the formation of a floating gate device.

For example, FIGS. 1A and 1B illustrate a schematic, and cross sectional views, respectively, of a prior art double poly (DP) electrically erasable and programmable "read only" memory (EEPROM) device 10. DP EEPROM device 10 comprises a floating gate (FG) transistor structure comprising a poly1 layer 21 and poly2 layer 22 formed overlying an oxide layer 20. Device 10 also illustrates that two highly variable capacitive regions or interfaces T1 (31) and T2 (32) are created in the formation of a floating gate device within an inter-poly dielectric layer between the poly1 layer 21 and poly2 layer 22.

The DP EEPROM technology uses Fowler-Nordheim (F-N) tunneling through the inter-poly dielectric layer of these capacitive interfaces T1 (31) and T2 (32). However, it is very difficult to control the quality of such dielectric layers, particularly at the edges of the poly1 layer 21 as shown in the smaller circles at junctions 31 and 32. One reason for this variation is that at the Poly 1 layer 21 edge (upper right hand corner of Poly 1 21), the corner may be sharp as at 32, or may be rounded as at 31. Further, the gate oxide used in the present invention is much better quality than the inter-poly oxides used in the prior art. As charge concentration may be dramatically increased at sharp edges, the F-N conduction through capacitive interface T2 at 32 may be much different than at capacitive interface T1 at 31. These effects result in erratic Vt and/or unreliable memory storage characteristics.

Figure 2A:
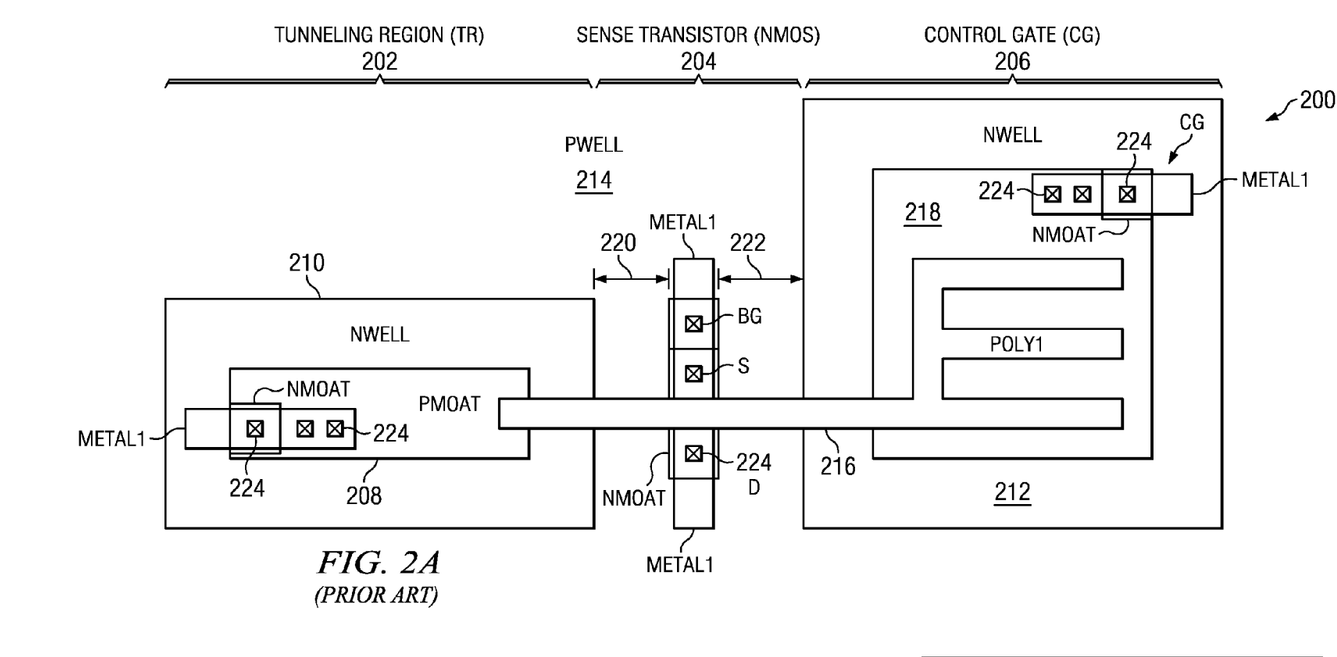
FIG. 2A is a top plan view of a conventional single-poly electrically erasable and programmable "read only" memory (EEPROM) employing a tunneling region (TR), a sense or read transistor, and a control gate region (CG) formed in a semiconductor substrate.

FIG. 2A illustrates another conventional single-poly EEPROM device 200, employing a single tunneling region (TR) 202, an NMOS sense (read) transistor 204, and a control gate (CG) 206, such as may be formed in a semiconductor substrate. The tunneling region TR 202 and the control gate CG 206 are formed in separate n-well regions 210 and 212 respectively, separated by the NMOS sense transistor 204 formed in a p-well region 214 therebetween. Sense transistor 204 has source S, drain D, and back-gate BG terminals at contacts 224, such as may be formed in or above the metal 1 or METAL1 layer along with the CG terminal of the control gate CG 206, and the NMOAT terminal of the tunneling region TR 202. The tunneling region 202 further comprises a p-type doped region 208 within the n-well 210, and the control gate CG region 206 further comprises an n+ doped (NMOAT) region 218 within the n-well 212.

To accommodate the high voltage requirements of the single-poly EEPROM device 200, the sense transistor 204 is spaced a distance 220 (e.g., about 2 nm) from the tunneling region TR 202, and a distance 222 (e.g., about 3 nm) from the control gate CG 206. Because of the individual sizes of all these regions as well as the spacings between the regions, the overall area required of the conventional single-poly EEPROM may be quite large. Accordingly, by reducing the number of such memory devices as well as the area of the associated trim resistors needed to provide accurate trimming, the present invention offers a device having a greatly reduced total or overall device area requirement.

Figure 2B:
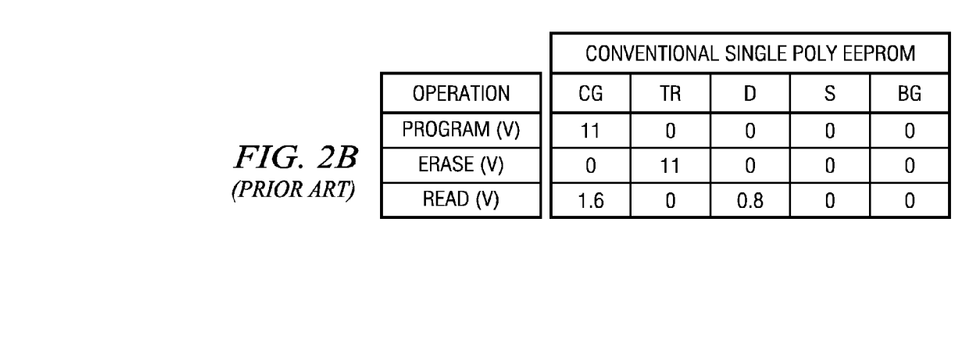
FIG. 2B is a memory operations chart for the conventional single-poly EEPROM of FIG. 2A, illustrating the voltages required at the various memory device electrodes employed for program, erase, and read operations.

FIG. 2B illustrates a chart of typical operational voltage requirements of the conventional single-poly EEPROM 200 of FIG. 2A. The chart of FIG. 2B illustrates the voltages required at the various memory device electrodes employed for program, erase, and read operations. For example, to program the single-poly EEPROM 200, 11 volts may be applied to the control gate electrode CG of the control gate CG region 206, while 0 volts is applied to the tunneling region electrode TR in the tunneling region 202, the drain electrode D, the source electrode S, and the back-gate electrode BG of the sense transistor 204.

Figure 3A:
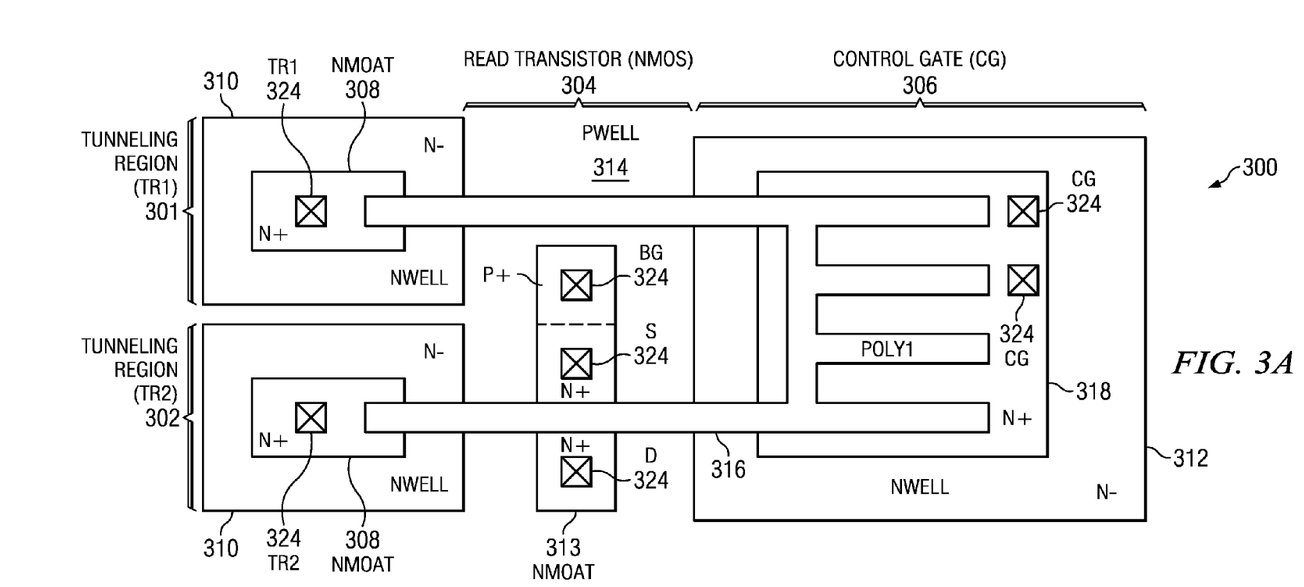
FIGS. 3A is a top plan view of an embodiment of a single-poly EEPROM memory device employing two tunneling regions (TR1 and TR2), a sense or read transistor, and a control gate region (CG) formed in a semiconductor substrate of the memory device at a later stage of fabrication, in accordance with an aspect of the present invention.

FIGS. 3A illustrates an embodiment of a single-poly EEPROM memory device 300 employing two tunneling regions (TR1 301 and TR2 302), a sense or read transistor 304, and a control gate region (CG) 306 formed in a semiconductor substrate of the memory device 300 at a later stage of fabrication, in accordance with an aspect of the present invention.

In one embodiment of the present invention, SP EEPROM device 300 comprises a control gate 306 isolated within a well 312 of a first conductivity type (e.g., an n-well 312) in a semiconductor body of a second conductivity type (e.g., an p-well region 314). Device 300 also comprises first and second tunneling regions (e.g., TR1 301 and TR2 302) isolated from one another within respective wells of the first conductivity type (e.g., n-well 310) in the semiconductor body (e.g., p-well 314), and a sense or read transistor 304 isolated within an n+ doped well of the first conductivity type (e.g., NMOAT 313). Device 300 further comprises a floating polysilicon gate FG 316 (e.g., poly1) overlying a portion of the control gate CG 306, the read transistor 304, and the first and second tunneling regions TR1 301 and TR2 302.

Further, within the n-well 310 of the first and second tunneling regions TR1 301 and TR2 302, are n+ doped (NMOAT) regions 308, and within the n-well 312 of the control gate CG 306 is another n+ doped (NMOAT) region 318.

An advantage over the prior art, particularly the floating poly device of FIGS. 1A and 1B, here is that the floating polysilicon gate FG 316 (e.g., poly1) of the present invention is separated from the underlying tunneling region structures, control gate and read transistor by a gate oxide material (e.g., about 75 Angstroms thick), which is a high quality thermal oxide rather than the lower quality inter-poly dielectric material used in the prior art. In addition, the floating poly gate FG 316 is a single polysilicon material (e.g., poly1), rather than the poly1/poly2 hybrid or composite floating gate of the prior art of FIGS. 1A and 1B. Finally, the floating gate structure of the present invention, is formed as a continuous layer overlying and insulated from the silicon substrate by the gate oxide, thus, no sharp edges are formed in between in the tunneling regions or between the floating poly and the underlying monocrystalline silicon substrate and well areas (e.g., p-well 314, n-well 310, 312). Thus, a surface-to-surface interface is formed rather than a potentially highly variable tunneling region which incorporates local variations due to edge effects.

Read transistor 304 has source S, drain D, and back-gate BG terminals or contacts 324, such as may be formed in or above a metal 1 or METAL1 layer along with the CG terminal 324 of the control gate CG 306, and the NMOAT terminal 324 of the tunneling regions TR1 301 and TR2 302.

Figure 3B:
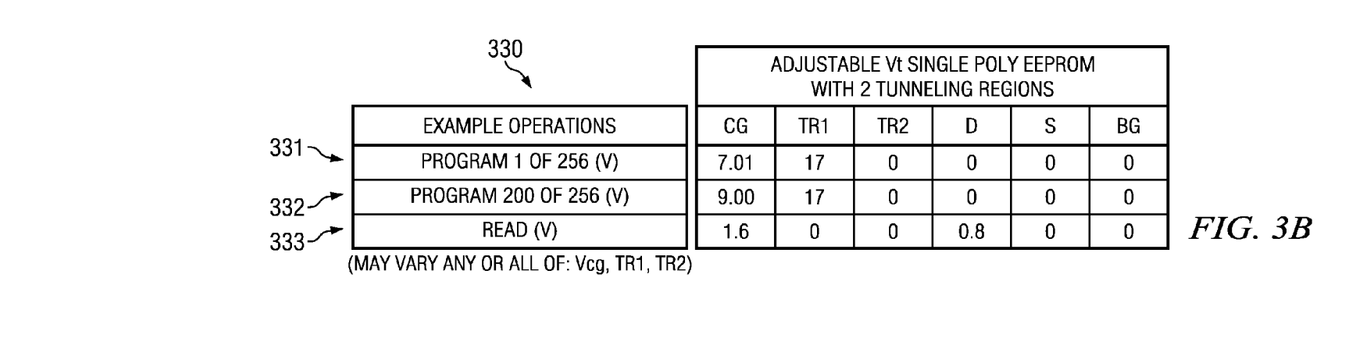
FIG. 3B is a memory operations chart for the single-poly EEPROM of FIG. 3A, illustrating the voltages required at the various memory device electrodes employed for programming two exemplary Vt levels, and for a read operation.

Memory device 300 is configured to be electrically programmed to a very precise threshold voltage (Vt), for example, by changing or inducing a charge or change of charge on the floating gate FG 316 as illustrated in FIG. 3B.

FIG. 3B, for example, illustrates a memory operations chart 330 for the single-poly EEPROM 300 of FIG. 3A, further illustrating the voltages required at the various memory device electrodes (e.g., CG, TR1, TR2, D, S, BG) employed for programming two exemplary Vt levels, and for a read operation.

For example, the analog SP EEPROM memory device 300 may be precisely programmed to any 1 of 256 different levels associated with a state, voltage, or a Vt, by inducing a corresponding charge onto the floating gate FG 316. In particular, as a charge is induced onto the floating gate FG 316, the Vt of the SP EEPROM memory device 300 changes correspondingly, or at least as some function of the charge on the floating gate FG 316.

The SP EEPROM memory device 300 has a large coupling ratio (e.g., greater than about 70%) created by the capacitive coupling between the control gate CG 306 and the floating gate FG 316, which allows charge to be easily added to the floating gate FG 316, and also allows the control gate to have a strong control characteristic over the device 300. Conventionally, such as in EEPROM device 200 of FIG. 2A, a tunneling region is used to erase the EEPROM memory device 200. The present invention, however, has no need of such an erase function (e.g., to establish an erased state), but instead needs to be able to remove or add charge to the floating gate FG 316 structure according to the desired program (or trim) level. To accommodate this charge removal need, the memory device 300 of the present invention utilizes the two tunneling regions TR1 301 and TR2 302 to establish a current flow therebetween by way of the floating gate FG 316. Then, if a subsequent program level requires that charge be removed from the floating gate FG 316, the current path to the lower potential tunneling region will serve as a current sinking means to reduce the charge from the floating gate FG 316.

Returning to the example chart 330 of FIG. 3B, if it is desired to obtain a programming precision or resolution of 256 levels, this may be established over a control gate voltage range such as between 7.00 volts to 9.56 volts, where 7.00 volts represents a 0 level of 256, 7.01 volts represents a 1 level of 256 (at 331), 9.00 volts represents a 200 level of 256 (at 332), and 9.56 volts represents a 256 level of 256. Alternately, any number of bits of programming resolution (e.g., 2, 4, 8, 12, 16 bits) may be applied to the SP EEPROM memory device 300 of FIG. 3A.

For example, and as shown in the first programming line 331 of chart 330 of FIG. 3B (PROGRAM 1 of 256 (V)), a first potential of 17 volts is applied between TR1 301 and TR2 302, thereby establishing a small current flow therebetween, while a second potential (e.g., lower voltage) of 7.01 volts is applied to the control gate CG 306, and 0 volts is applied to the drain D, source S, and back-gate BG of the read transistor 304 (during a programming operation).

Similarly, at the second programming line 332 of chart 330 of FIG. 3B (PROGRAM 200 of 256 (V)), a first potential of 17 volts is applied between TR1 301 and TR2 302, thereby establishing a small current flow therebetween, while a second potential (e.g., lower voltage) of 9.00 volts is applied to the control gate CG 306, and 0 volts is applied to the drain D, source S, and back-gate BG of the read transistor 304 (during a programming operation).

Finally, during a read operation at line 333 of chart 330 of FIG. 3B (READ (V)), a first potential of about 1.6 volts is applied to the control gate CG 306, about 0.8 volts is applied to the drain D, and 0 volts is applied to tunneling regions (TR1 301 and TR2 302), the source S, and the back-gate BG of the read transistor 304. The control gate CG 306 read voltage of 1.6 volts is low enough to avoid charge injection. It will be noted, that during the read operation as well as during normal data storage/retention, no current flows between the tunneling regions (TR1 301 and TR2 302) or through the floating gate FG 316.

Alternately, to accomplish similar high precision programming in the SP EEPROM memory device 300, the control gate CG 306 voltage may be held constant (e.g., at 8V), while the potential applied to TR1 301 or TR2 302 is varied, for example, from 14 to 17 volts. In addition, the use and potentials applied to TR1 301 or TR2 302 are functionally interchangeable. Further, the first and second conductivity types (e.g., n-type and p-type dopant types) of SP EEPROM memory device 300 may be interchanged where functionally appropriate, within the context or spirit of the present invention, and such variations are anticipated.

Figure 4A:
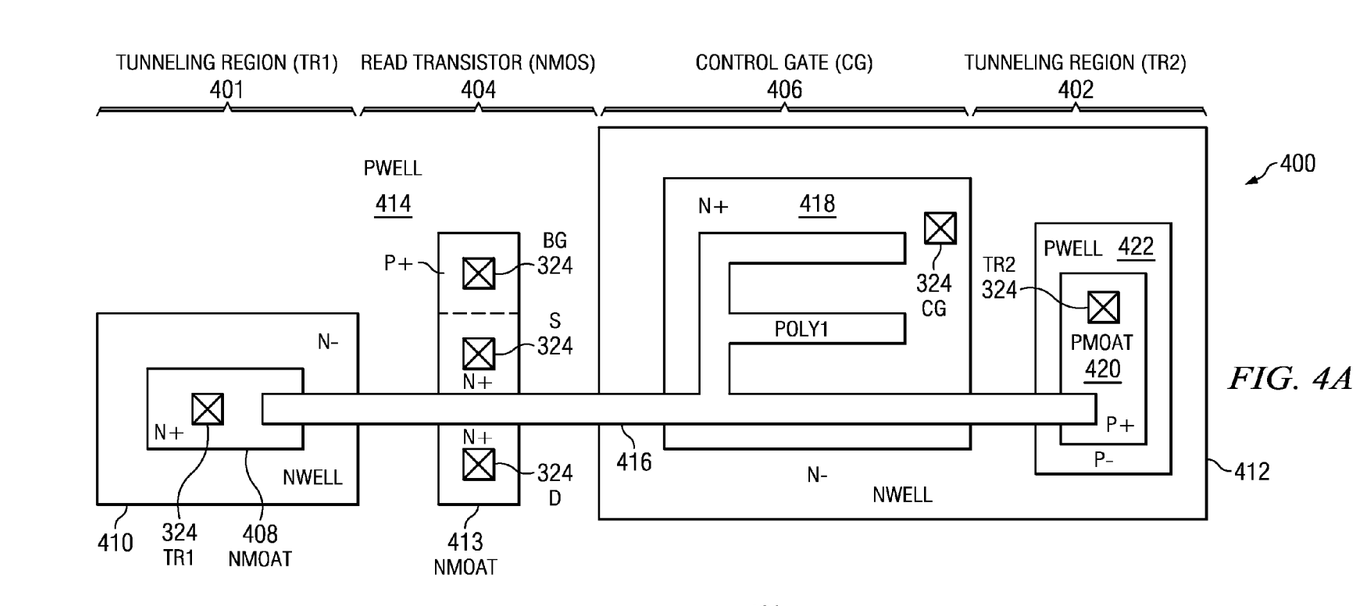
FIGS. 4A is a top plan view of an embodiment of a single-poly EEPROM memory device employing two tunneling regions (TR1 and TR2), a sense or read transistor, and a control gate region (CG) formed in a semiconductor substrate of the memory device at a later stage of fabrication, in accordance with an aspect of the present invention.
Figure 4B:
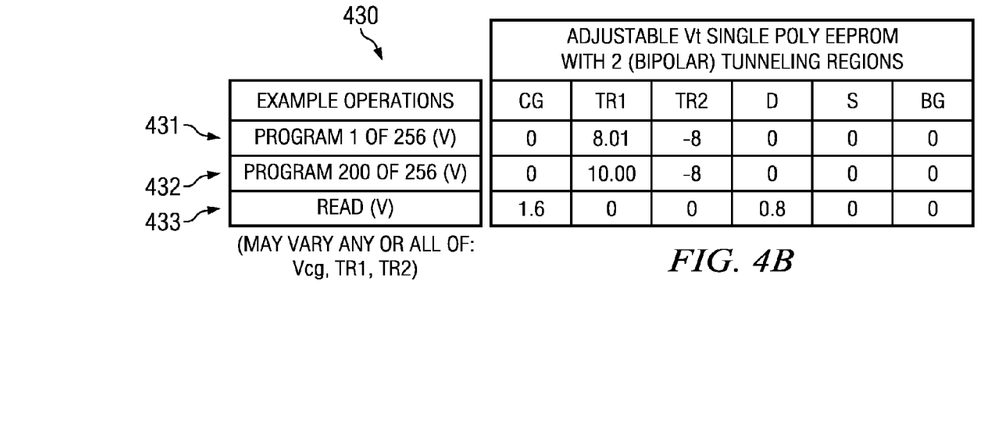
FIG. 4B is a memory operations chart for the single-poly EEPROM of FIG. 4A, illustrating the voltages required at the various memory device electrodes employed for programming two exemplary Vt levels, and for a read operation.

For example, FIGS. 4A and 4B illustrate another bi-polar arrangement embodiment of the present invention of a single-poly EEPROM memory device 400 employing two tunneling regions (TR1 401 and TR2 402), a sense or read transistor 404, and a control gate region (CG) 406 formed in a semiconductor substrate of the memory device 400 at a later stage of fabrication, in accordance with an aspect of the present invention.

In this embodiment of the present invention, SP EEPROM device 400 comprises a control gate 406 isolated within a first well 412 of a first conductivity type (e.g., an n-well 412) in a semiconductor body of a second conductivity type (e.g., p-well region 414). Device 400 also comprises a first tunneling region TR1 401 isolated within a second well of the first conductivity type (e.g., n-well 410) in the semiconductor body, a second tunneling region TR2 402 isolated within a third well of the second conductivity type (e.g., p-well 422) in the semiconductor body (e.g., p-well region 414), and a sense or read transistor 404 isolated within a fourth well of a first conductivity type (e.g., NMOAT 413). Device 400 further comprises a floating polysilicon gate FG 416 (e.g., poly1) overlying a portion of the control gate CG 406, the read transistor 404, and the first and second tunneling regions TR1 401 and TR2 402.

Further, within the n-well 410 of the first tunneling region TR1 401, is an n+ doped (NMOAT) regions 408, within the p-well 422 of the second tunneling region TR2 402, is an p+ doped (PMOAT) region 420, and within the n-well 412 of the control gate CG 406 is another n+ doped (NMOAT) region 418.

Read transistor 404 has source S, drain D, and back-gate BG terminals or contacts 424, such as may be formed in or above a metal 1 or METAL1 layer along with the CG terminal 424 of the control gate CG 406, and the NMOAT terminal 424 of the tunneling region TR1 401, and the PMOAT terminal 424 of the tunneling region TR2 402.

Memory device 400 is configured to be electrically programmed to a very precise threshold voltage (Vt), for example, by changing or inducing a charge or change of charge on the floating gate FG 416 as illustrated in FIG. 4B.

FIG. 4B, for example, illustrates a memory operations chart 430 for the bipolar arrangement single-poly EEPROM 400 of FIG. 4A, further illustrating the voltages required at the various memory device electrodes (e.g., CG, TR1, TR2, D, S, BG) employed for programming two exemplary Vt levels, and for a read operation.

For example, the analog SP EEPROM memory device 400 may also be precisely programmed to any 1 of 256 different levels associated with a state, voltage, or a Vt, by inducing a corresponding charge onto the floating gate FG 416. In particular, as a charge is induced onto the floating gate FG 416, the Vt of the SP EEPROM memory device 400 changes correspondingly, or at least as some function of the charge on the floating gate FG 416.

In the example chart 430 of FIG. 4B, if it is desired to obtain a programming precision or resolution of 256 levels, this may be established over a tunneling region (or control gate) voltage range such as between 8.00 volts to 10.56 volts, where 8.00 volts represents a 0 level of 256, 8.01 volts represents a 1 level of 256 (at 431), 10.00 volts represents a 200 level of 256 (at 432), and 10.56 volts represents a 256 level of 256. Alternately, any number of bits of programming resolution (e.g., 2, 4, 8, 12, 16 bits) may be applied to the SP EEPROM memory device 400 of FIG. 4A.

For example, and as shown in the first programming line 431 of chart 430 of FIG. 4B (PROGRAM 1 of 256 (V)), a potential of 16 volts is applied between TR1 401 and TR2 402, such as by applying a first potential of 8.01 volts to the first tunneling region TR1 401 and a second potential of −8.0 volts to the second tunneling region TR2 402, thereby establishing a small current flow therebetween, while a third potential of 0.0 volts is applied to the control gate CG 406, the drain D, source S, and back-gate BG of the read transistor 404 (during a programming operation).

Similarly, at the second programming line 432 of chart 430 of FIG. 4B (PROGRAM 200 of 256 (V)), a potential of 18 volts is applied between TR1 401 and TR2 402, such as by applying a first potential of 10.00 volts to the first tunneling region TR1 401 and a second potential of −8.0 volts to the second tunneling region TR2 402, thereby establishing a small current flow therebetween, while a third potential of 0.0 volts is applied to the control gate CG 406, the drain D, source S, and back-gate BG of the read transistor 404 (during a programming operation).

Finally, during a read operation at line 433 of chart 430 of FIG. 4B (READ (V)), a first potential of about 1.6 volts is applied to the control gate CG 406, about 0.8 volts is applied to the drain D, and 0 volts is applied to both tunneling regions (TR1 401 and TR2 402), the source S, and the back-gate BG of the read transistor 404. The control gate CG 406 read voltage of 1.6 volts is low enough to avoid charge injection. It will be noted, that during the read operation as well as during normal data storage/retention, no current flows between the tunneling regions (TR1 401 and TR2 402) or through the floating gate FG 416.

Alternately, to accomplish similar high precision programming in the SP EEPROM memory device 400, the control gate CG 406 voltage may be varied, for example, from 0 to 2.56 volts, while the potential applied to TR1 401 is held constant (e.g., at about +8V) and TR2 402 is held constant (e.g., at about −8V). In addition, the use and potentials applied to TR1 401 or TR2 402 are functionally interchangeable. Further, the first and second conductivity types (e.g., n-type and p-type dopant types) of the SP EEPROM memory device 400 may be interchanged where functionally appropriate, within the context and spirit of the present invention, and such variations are anticipated.

Thus, the present invention provides a reduced complexity SP EEPROM memory device with a net reduction in overall area and cost, for example, for analog integrated circuits which require trimming. In one embodiment, the device of the present invention can be electrically reprogrammed to a highly accurate threshold voltage based on a charge induced on the floating gate. The memory device is also suitable for use as a high-resolution analog memory device, for example, for analog device trimming functions, for analog to digital or digital to analog conversion, or as a precision voltage reference. The memory device is also anticipated to provide better reliability than competitive DP EEPROM device, by utilizing a high quality gate oxide layer that is thermally grown overlying the monocrystalline silicon and the wells formed therein to isolate the floating gate (e.g., FG 316, 416).

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A memory device, comprising:
 a control gate isolated within a semiconductor body;
 first and second tunneling regions isolated from one another within the semiconductor body;
 a read transistor; and
 a floating gate overlying a portion of the control gate, the read transistor, and the first and second tunneling regions.

2. The memory device of claim 1, wherein the capacitance between the control gate and the floating gate provides a coupling ratio of at least 70%.

3. The memory device of claim 2, wherein the memory device is configured to be electrically programmed by changing a potential on the control gate to induce a charge on the floating gate resulting in a change in the threshold voltage Vt of the memory device, by applying a first and second potential between the first tunneling region and the second tunneling region, and a third potential to the control gate, and wherein the third potential has a value less than the first potential.

4. The memory device of claim 1, wherein the memory device is configured to be electrically programmed by applying a first potential to the first tunneling region, a second potential to the second tunneling region, and a third potential to the control gate.

5. The memory device of claim 4, wherein the memory device is configured to be electrically programmed by electrically changing a threshold voltage Vt of the memory device based on a charge induced on the floating gate by changing the third potential on the control gate.

6. The memory device of claim 5, wherein the read transistor is configured to determine the threshold voltage programmed into the memory device.

7. The memory device of claim 1, wherein the memory device further comprises a control gate electrode connected to the control gate, a first tunneling electrode connected to the first tunneling region, a second tunneling electrode connected to the second tunneling region, a source electrode connected to a source region of the read transistor, a drain electrode connected to a drain region of the read transistor, and a back-gate electrode connected to a back-gate region of the semiconductor body.

8. The memory device of claim 1, wherein the memory device is configured to be electrically programmed by applying a first and second potential between the first tunneling region and the second tunneling region, and a third potential to the control gate.

9. The memory device of claim 1, wherein the memory device is configured to be electrically programmed by applying a first and second potential between the first tunneling region and the second tunneling region, and a third potential to the control gate, and wherein the third potential has a value less than the first potential.

10. The memory device of claim 1, wherein
 the control gate is isolated within a first conductivity type well in the semiconductor body of a second conductivity type,
 the first and second tunneling regions are isolated from one another within respective first conductivity type wells in the semiconductor body, and
 the read transistor is isolated within a first conductivity type well in the semiconductor body.

11. The memory device of claim 10, wherein one of the first and second conductivity types comprises one of an n-type and a p-type semiconductor material.

12. The memory device of claim 1, wherein the memory device comprises one of a single-poly EEPROM, and a modified OTP EPROM.

13. The memory device of claim 1, wherein the read transistor is configured to determine the threshold voltage programmed into the memory device.

14. The memory device of claim 1, wherein the floating gate overlying the portion of the control gate, the read transistor, and the first and second tunneling regions is isolated therefrom by a gate oxide layer formed by a thermal oxidation process.

15. A single-poly EEPROM memory device, comprising:
 a control gate isolated within a well of a first conductivity type in a semiconductor body of a second conductivity type;
 first and second tunneling regions isolated from one another within respective wells of the first conductivity type in the semiconductor body;
 a read transistor isolated within a well of the first conductivity type in the semiconductor body; and
 a floating gate overlying a portion of the control gate, the read transistor, and the first and second tunneling regions, the floating gate isolated therefrom by a gate oxide layer;
 wherein the memory device is configured to be electrically programmed by changing a charge on the floating gate that changes a threshold voltage Vt of the memory device.

16. The memory device of claim 15, wherein the capacitance between the control gate and the floating gate provides a coupling ratio of at least 70%.

17. The memory device of claim 15, wherein the memory device is configured to be electrically programmed by applying a first potential between the first and the second tunneling regions, and a second potential to the control gate.

18. The memory device of claim 15, wherein the memory device is configured to be electrically programmed by applying a first potential between the first tunneling region and the second tunneling region, and a second potential to the control gate, and wherein the second potential has a value less than the first potential.

19. The memory device of claim 15, wherein one of the first and second conductivity types comprises one of an n-type and a p-type semiconductor material.

20. A single-poly EEPROM memory device, comprising:
a control gate isolated within a first well of a first conductivity type in a semiconductor body of a second conductivity type;
a first tunneling region isolated within a second well of the first conductivity type in the semiconductor body;
a second tunneling region isolated within a third well of the second conductivity type;
a read transistor isolated within a fourth well of a first conductivity type in the semiconductor body; and
a floating gate overlying a portion of the control gate, the read transistor, and the first and second tunneling regions, the floating gate isolated therefrom by a gate oxide layer;
wherein the memory device is configured to be electrically programmed by changing a threshold voltage Vt of the memory device based on a charge induced onto the floating gate.

21. The memory device of claim 20, wherein the third well resides within the first well.

22. A method of electrically programming a memory device, comprising:
providing the memory device comprising a floating gate overlying first and second tunneling regions, a control gate, and a read transistor;
applying a first potential to the first tunneling region;
applying a second potential to the second tunneling region; and
applying a third potential to the control gate to induce a charge on the floating gate thereby electrically programming a threshold voltage Vt of the memory device.

23. The method of claim 22, wherein the first and second potentials are different, and wherein the third potential has a value which is between the first and second potentials.

24. The method of claim 22, wherein the memory device comprises one of a single-poly EEPROM, and a modified OTP EPROM.

* * * * *